(12) United States Patent
Chien et al.

(10) Patent No.: US 9,313,882 B2
(45) Date of Patent: Apr. 12, 2016

(54) ELECTRONIC DEVICE AND ELECTRONIC COMPONENT THEREOF

(71) Applicants: Inventec (Pudong) Technology Corporation, Shanghai (CN); INVENTEC CORPORATION, Taipei (TW)

(72) Inventors: Hsin-Fang Chien, Taipei (TW); Shui-Ching Chu, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 104 days.

(21) Appl. No.: 14/182,163

(22) Filed: Feb. 17, 2014

(65) Prior Publication Data
US 2015/0096794 A1    Apr. 9, 2015

(30) Foreign Application Priority Data
Oct. 8, 2013    (CN) .......................... 2013 1 0465165

(51) Int. Cl.
*H05K 1/02*    (2006.01)
*H05K 3/34*    (2006.01)

(52) U.S. Cl.
CPC ............ *H05K 1/0271* (2013.01); *H05K 3/3426* (2013.01); *H05K 2201/068* (2013.01); *H05K 2201/10757* (2013.01)

(58) Field of Classification Search
CPC ............................ H05K 1/02; H05K 2201/068
USPC ........................................................ 174/260
See application file for complete search history.

(56) References Cited

U.S. PATENT DOCUMENTS

| | | | | |
|---|---|---|---|---|
| 4,271,426 | A * | 6/1981 | Hargis | 257/700 |
| 6,225,560 | B1 * | 5/2001 | Machado | 174/556 |
| 6,691,398 | B2 * | 2/2004 | Gutierrez | 29/592.1 |
| 6,877,211 | B2 * | 4/2005 | Machado | 29/602.1 |

\* cited by examiner

*Primary Examiner* — Michael F McAllister
(74) *Attorney, Agent, or Firm* — Locke Lord LLP; Tim Tingkang Xia, Esq.

(57) ABSTRACT

An electronic device and an electronic component thereof include a main body and several pins. One side of the main body has several recesses. Each of the recesses has a first inner width along a first direction. The first direction is substantially parallel to a long side of the main body. The pins are respectively inserted into the recesses. Each of the pins has a first outer width along the first direction. The first outer width is smaller than the first inner width.

6 Claims, 4 Drawing Sheets

ELECTRONIC DEVICE AND ELECTRONIC COMPONENT THEREOF

CROSS-REFERENCE TO RELATED APPLICATIONS

This non-provisional application claims priority under 35 U.S.C. §119(a) on Patent Application No(s). 201310465165.1 filed in China on Oct. 8, 2013, the entire contents of which are hereby incorporated by reference.

TECHNICAL FIELD

The disclosure relates to an electronic device and an electronic component thereof, more particularly to an electronic device and its electronic component having a plurality of pins.

BACKGROUND

In general, an electronic component is disposed on a printed circuit board inside an electronic device by reflowing (namely, reflow soldering), and the multiple electronic components are electrically connected with each other by conductive traces on the printed circuit board. During reflowing process, the printed circuit board and the electronic components are heated such that the electronic component is thermally connected with the printed circuit board by a solder pad. However, the main material of the electronic component is different from that of the printed circuit board, so the electronic component and the printed circuit board are contracted to different extents after the soldering based on the different materials. Hence, even the pin of the electronic component is precisely aligned with the solder pad of the printed circuit board before the reflowing process, the pin may be misaligned with the solder pad or the solder wire may break into two or more pieces after reflowing. When the electronic component is a rectangular shape, the pins, respectively located on the two ends along a long side of the electronic component, may not successfully solder on the solder pads.

In order to prevent the solder-joint failure, the materials with similar coefficients of thermal expansion are chosen by the related business for producing the electronic component and the printed circuit board. However, after a large quantity of experiments and tests are executed to choose the materials, the costs of the chosen materials are usually higher than others.

Therefore, it is urgent and essential to design an electronic device that the coefficients of thermal expansion of the electronic component and the printed circuit board are different and the solder-joint failure is avoided.

SUMMARY

An embodiment of the disclosure provides an electronic component comprising a main body and a plurality of pins. One side of the main body has a plurality of recesses. Each of the recesses has a first inner width along a first direction. The first direction is substantially parallel to a long side of the main body. The multiple pins are respectively inserted into the plurality of recesses. Each of the pins has a first outer width along the first direction. The first outer width is smaller than the first inner width.

An embodiment of the disclosure provides an electronic device comprising an electronic component and a printed circuit board. The electronic component comprises a main body and a plurality of pins. One side of the main body has a plurality of recesses. Each of the recesses has a first inner width along a first direction. The first direction is substantially parallel to a long side of the main body. The multiple pins are respectively inserted into the plurality of recesses. Each of the pins has a first outer width along the first direction. The first outer width is smaller than the first inner width. The printed circuit board has a plurality of solder pads. The plurality of pins are soldered on the plurality of soldering pads, respectively.

BRIEF DESCRIPTION OF THE DRAWING

The disclosure will become more fully understood from the detailed description given herein below and the drawing are for illustration only, and thus does not limit the present disclosure, wherein.

DETAILED DESCRIPTION

Figure 1A:
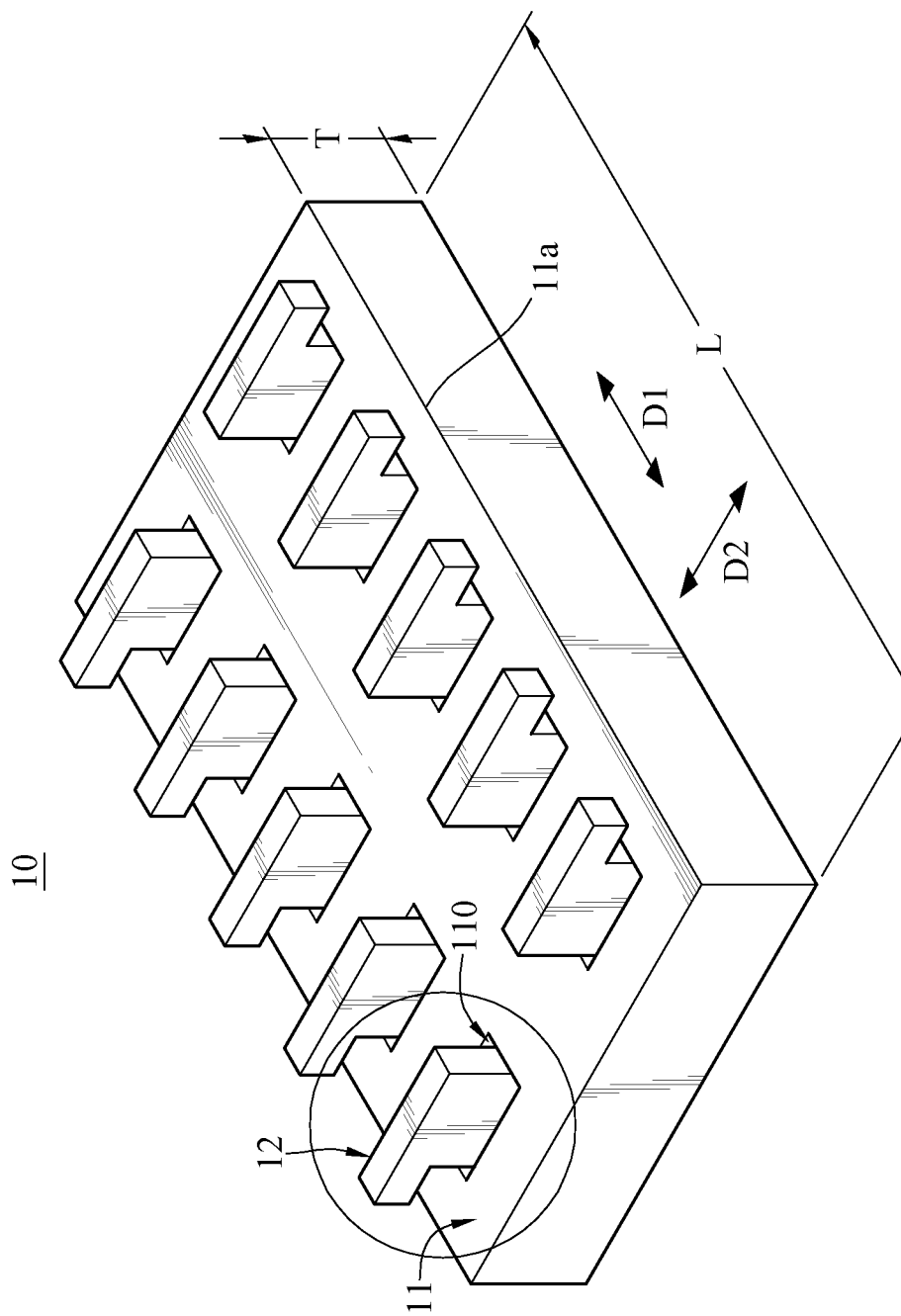
FIG. 1A is a perspective view of an electronic component according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1B:
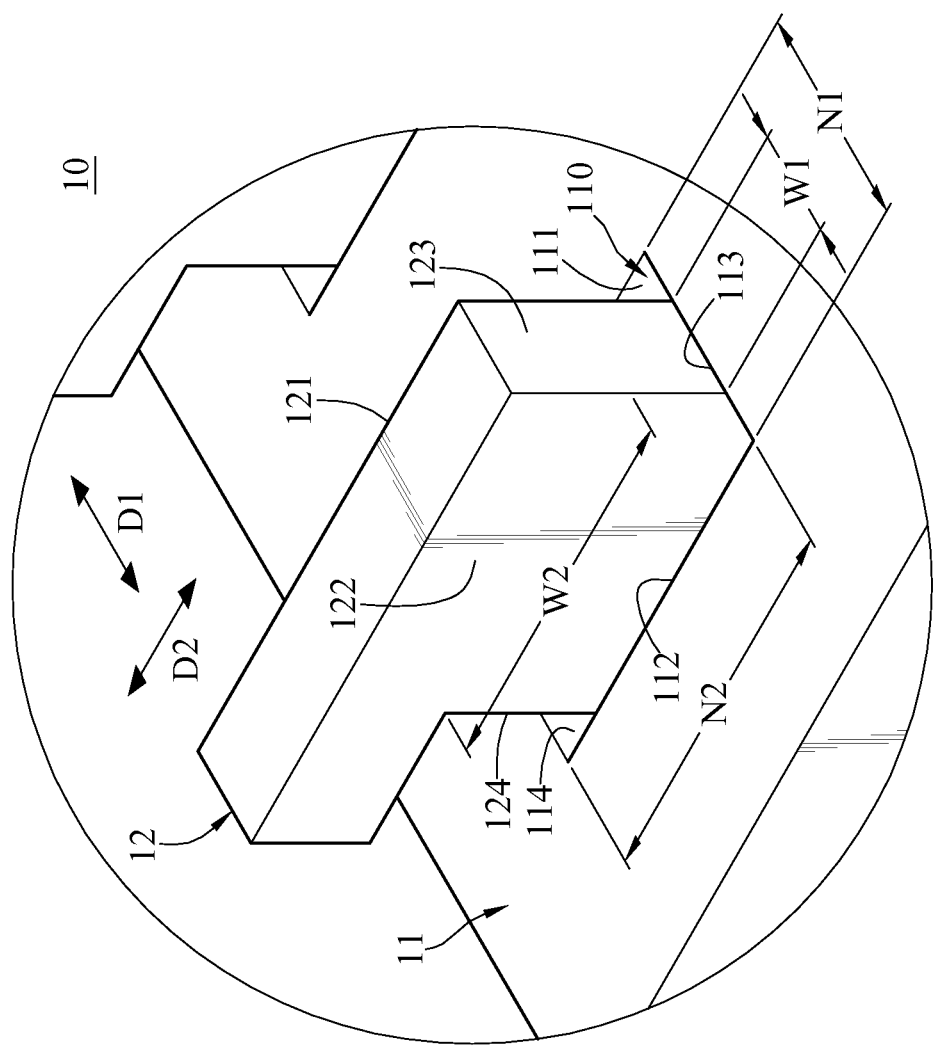
FIG. 1B is a partial enlarged view described in FIG. 1A.

Please refer to FIG. 1A and FIG. 1B. FIG. 1A is a perspective view of an electronic component according to an embodiment of the disclosure. FIG. 1B is a partial enlarged view described in FIG. 1A. In this embodiment of the disclosure, an electronic component 10 comprises a main body 11 and a plurality of pins 12. One side of the main body 11 has a plurality of recesses 110. Each of the recesses 110 has a first inner width N1 along a first direction D1, and the first direction D1 is substantially parallel to a long side 11a of the main body 11. The plurality of pins 12 are respectively inserted into the plurality of recesses 110. Each of the pins has a first outer width W1 along the first direction D1, and the first outer width W1 is smaller than the first inner width N1.

In this embodiment of the disclosure, for example, the length L of the long side 11a is 12 millimeters (mm) and the thickness T may is 2 to 4 mm. The difference between the first inner width N1 and the first outer width W1 is substantially equal to 0.06 mm when the deformation of the electronic component 10 has been taken into account.

In this embodiment, each of the recesses 110 has a first inner lateral side 111 and a second inner lateral side 112 which is opposite to the first inner lateral side 111, the distance between the first inner lateral side 111 and the second inner lateral side 112 is equal to the first inner width N1. Each of the pin 12 has a first outer lateral side 121 and a second outer lateral side 122 which is opposite to the first outer lateral side 121, the distance between the first outer lateral side 121 and the second outer lateral side 122 is equal to the first outer width W1. A gap is formed between the first inner lateral side 111 and the first outer lateral side 121, and another gap is formed between the second inner lateral side 112 and the second outer lateral side 122. The width of one of the gaps may be the same as that of the other gap, or may be different from the other gap, but the disclosure is not limited thereto. In other embodiment of the disclosure, a gap is formed between the first inner lateral side 111 and the first outer lateral side 121, and the second outer lateral side 122 is in direct contact with the second inner lateral side 112. In another embodiment of the disclosure, a gap is formed between the second inner lateral side 112 and the second outer lateral side 122, and the first outer lateral side 121 is in contact with the first inner lateral side 111.

In this embodiment, each of the recesses 110 has a second inner width N2 along a second direction D2 which is substantially perpendicular to the first direction D1, and each of the pins 12 has a second outer width W2 along the second direction D2. The second inner width N2 is substantially equal to the second outer width W2.

Specifically, each of the recesses 110 has a third inner lateral side 113 and a fourth inner lateral side 114 which is opposite to the third inner lateral side 113. The distance between the third inner lateral side 113 and the fourth inner lateral side 114 is equal to the second inner width N2. Each of the pins 12 has a third outer lateral side 123 and a fourth outer lateral side 124 which is opposite to the third outer lateral side 123. The distance between the third outer lateral side 123 and the fourth outer lateral side 124 is equal to the second outer width W2. The third inner lateral side 113 is in contact with the third outer lateral side 123, and the fourth inner lateral side 114 is in contact with the fourth outer lateral side 124. Therefore, the pin 12 is inserted into the recess 110 between the third inner lateral side 113 and the fourth inner lateral side 114, and is in contact with both inner lateral sides 113,114.

Figure 2:
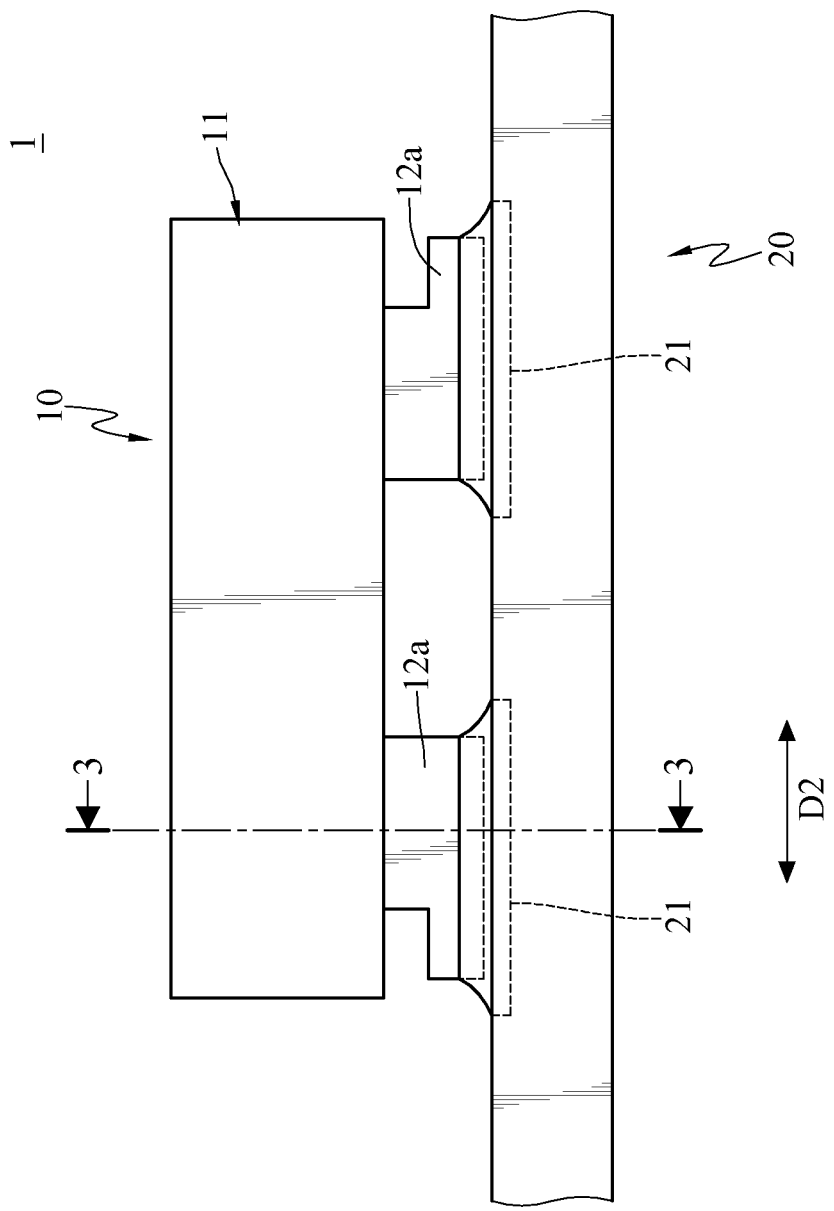
FIG. 2 is a side view of an electronic device according to another embodiment of the disclosure.
Figure 3:
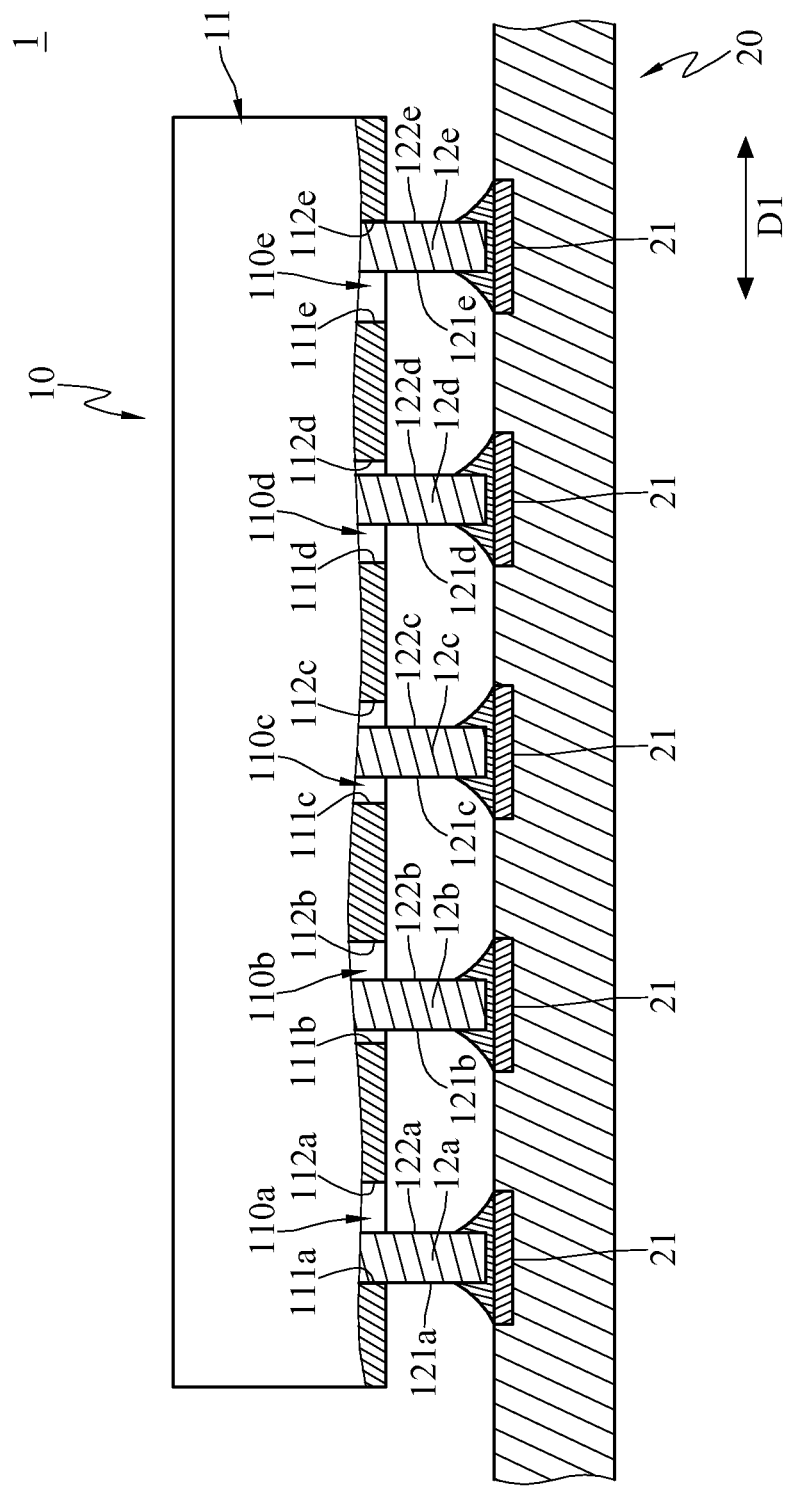
FIG. 3 is a cross-sectional view of the electronic device along a line 3-3 described in FIG. 2.

Please refer to the FIG. 2 and FIG. 3. FIG. 2 is a side view of an electronic device according to another embodiment of the disclosure. FIG. 3 is a cross-sectional view of the electronic device along a line 3-3 described in FIG. 2. The electronic device 1 comprises an electronic component 10 and a print circuited board 20. The print circuited board 20 has a plurality of solder pads 21, and the plurality of pins 12a, 12b, 12c, 12d and 12e are soldered on the plurality of solder pads 21, respectively.

However, the coefficients of the thermal expansion of the main body 11 of the electronic component 10 are different from that of the print circuited board 20. Therefore, when the plurality of pins 12a, 12b, 12c, 12d and 12e are respectively soldered on the plurality of solder pads 21, and the electronic component 10 and the print circuited board 20 are reflowed inside the oven and are cooled down after the reflow, the amount of deformation of the main body 11 is different from that of the print circuited board 20 because of the differences of the coefficients of thermal expansion. When the main body 11 is deformed relatively to the print circuited board 20, the pins 12a, 12b, 12c, 12d and 12e, which are originally inserted into the central of the recesses 110a, 110b, 110c, 110d and 110e, are shifted inside the recesses 110a, 110b, 110c, 110d and 110e relatively to the main body 11. Therefore, all the pins 12a, 12b, 12c, 12d and 12e keep the fixed distance with the corresponding solder pads 21.

As shown in FIG. 3, the coefficients of the thermal expansion of the main body 11 of the electronic component 10 are higher than that of the print circuited board 20, thus, the amount of deformation of the main body 11 is larger than that of print circuited board 20 accordingly after the reflowing process. The following is the example with respect to the relative positions between the pins 12a, 12b, 12c, 12d and 12e and the recesses 110a, 110b, 110c, 110d and 110e when the pins 12a, 12b, 12c, 12d and 12e are automatically and fixedly connected with the solder pads 21.

Regarding to the pin 12a and the recess 110a located at the far left side of FIG. 3, the first outer lateral side 121a of the pin 12a is in contact with the first inner lateral side 111a of the recess 110a, and a gap is formed between the second inner lateral side 112a of the recess 110a and the second outer lateral side 122a of the pin 12a. Regarding to the pin 12e and the recess 110e located at the far right side of FIG. 3, a gap is formed between the first inner lateral side 111e of the recess 110e and the first outer lateral side 121e of the pin 12e, and the second outer lateral side 122e of the pin 12e is in contact with the second inner lateral side 112e of the recess 110e. Because the leftmost recess 110a and the rightmost recess 110e are the outermost recesses of the main body 11, respectively, where leads to the largest displacement among the recesses 110a, 110b, 110c, 110d and 110e when the main body 11 is deformed. Therefore, the margins of the displacement, which allow the pins 12a, 12e to be moved inside the recesses 110a, 110e, are almost run out.

Regarding to the pin 12b and the recess 110b located at the second from the left side of FIG. 3, a gap is formed between the first inner lateral side 111b of the recess 110b and the first outer lateral side 121b of the pin 12b, and another gap is also formed between the second inner lateral side 112b of the recess 110b and the second outer lateral side 122b of the pin 12b. However, the width of the gap between the first inner lateral side 111b and the first outer lateral side 121b is smaller than that between the second inner lateral side 112b and the second outer lateral side 122b. Regarding to the pin 12d and the recess 110d located at the second from the right side of FIG. 3, a gap is formed between the first inner lateral side 111d of the recess 110d and the first outer lateral side 121d of the pin 12d. In addition, another gap is also formed between the second inner lateral side 112d of the recess 110d and the second outer lateral side 122d of the pin 12d. However, the width of the gap between the first inner lateral side 111d and the first outer lateral side 121d is longer than that between the second inner lateral side 112d and second outer lateral side 122d. Because the recess 110b at the second from the left side and the recess 110d at the second from the right side are both located between the outermost side and the central area of the main body 11, where leads to the second largest displacement among the recesses 110a, 110b, 110c, 110d and 110e when the main body 11 is deformed. Therefore, the margins of the displacement, which allow the pins 12b, 12d to be moved inside the recesses 110b, 110d, are partially run out.

Regarding to the pin 12c and the recess 110c located in the central area of FIG. 3, a gap is formed between the first inner lateral side 111c of the recess 110c and the first outer lateral side 121c of the pin 12c, and another gap is also formed between the second inner lateral side 112c of the recess 110c and the second outer lateral side 122c of the pin 12c. In addition, the width of the gap between the first inner lateral side 111c and the first outer lateral side 121c is substantially equal to that between the second inner lateral side 112c and the second outer lateral side 122c. Because the recess 110c is located in the central area of the main body 11, there is almost no displacement when the main body 11 is deformed. Therefore, the margins of the displacement, which allow the pins 12c to be moved inside the recesses 110c are hardly run out. Hence, even each of the pins 12a, 12b, 12c, 12d and 12e cause different displacements relative to the printed circuit board 20, each of the pins 12a, 12b, 12c, 12d and 12e shifts relative to main body 11 by different displacements inside the recesses 110a, 110b, 110c, 110d and 110e and keep the fixed distance with the solder pads 21 of the printed circuit board 20, respectively. Therefore, the reflow soldering process, which performs on the pins 12a, 12b, 12c, 12d and 12e and the solder pads 21, is not easily failed even the main body 11 is deformed relative to the printed circuit board 20.

According to the embodiment of the electronic device and the electronic component, the pins are inserted into the recesses having the first inner width being larger than the first outer width, such that the pins shift inside the recesses with enough margin of displacement along the first direction. When the electronic component is cooled down after the reflow soldering process, even the main body of the electronic component is deformed relative to the printed circuit board, the pins still shift relative to the main body and keep the fixed distance with the solder pads of the printed circuit board, which prevents the reflow soldering process from failure. Because the second inner width of the recess is substantially equal to the second outer width of the pin, such that the pin is held by the main body along the second direction. Moreover, the difference of coefficients of thermal expansion between the main body and the printed circuit board, and the design of the electronic device prevents the reflow soldering process from failure, thereby increasing the lifespan of the electronic device.

What is claimed is:

1. An electronic component, comprising:
   a main body, one side of the main body having a plurality of recesses, wherein each of the recesses has a first inner width along a first direction, a second inner width along a second direction which is perpendicular to the first direction, a third inner lateral side, and a fourth inner lateral side which is opposite to the third inner lateral side, the first direction is parallel to a long side of the main body, and the distance between the third inner lateral side and the fourth inner lateral side is equal to the second inner width; and
   a plurality of pins respectively inserted into the plurality of recesses, wherein each of the pins has a first outer width along the first direction, a second outer width along the second direction, a third outer lateral side, and a fourth outer lateral side which is opposite to the third outer lateral side, the first outer width is smaller than the first inner width, the second inner width is equal to the second outer width, the distance between the third outer lateral side and the fourth outer lateral side is equal to the second outer width, the third inner lateral side is in contact with the third outer lateral side, and the fourth inner lateral side is in contact with the fourth outer lateral side.

2. The electronic component according to claim 1, wherein the difference between the first inner width and the first outer width is equal to 0.06 mm.

3. The electronic component according to claim 1, wherein each of the pin has a first outer lateral side and a second outer lateral side which is opposite to the first outer lateral side, the distance between the first outer lateral side and a second outer lateral side is equal to the first outer width, wherein each of the recesses has a first inner lateral side and a second inner lateral side which is opposite to the first inner lateral side, the distance between the first inner lateral side and the second inner lateral side is equal to the first inner width, wherein at least a gap is formed between the first inner lateral side and the first outer lateral side and between the second inner lateral side and the second outer lateral side.

4. An electronic device, comprising:
   an electronic component, comprising:
   a main body, one side of the main body having a plurality of recesses, wherein each of the recesses has a first inner width along a first direction, a second inner width along a second direction which is perpendicular to the first direction, a third inner lateral side, and a fourth inner lateral side which is opposite to the third inner lateral side, the first direction is parallel to a long side of the main body, and the distance between the third inner lateral side and the fourth inner lateral side is equal to the second inner width; and
   a plurality of pins respectively inserted into the plurality of recesses, wherein each of the pins has a first outer width along the first direction, a second outer width along the second direction, a third outer lateral side, and a fourth outer lateral side which is opposite to the third outer lateral side, the first outer width is smaller than the first inner width, the second inner width is equal to the second outer width, the distance between the third outer lateral side and the fourth outer lateral side is equal to the second outer width, the third inner lateral side is in contact with the third outer lateral side, and the fourth inner lateral side is in contact with the fourth outer lateral side; and
   a printed circuit board having a plurality of solder pads, wherein the plurality of pins are soldered on the plurality of soldering pads, respectively.

5. The electronic device according to claim 4, wherein the difference between the first inner width and the first outer width is equal to 0.06 mm.

6. The electronic device according to claim 4, wherein each of the pin has a first outer lateral side and a second outer lateral side which is opposite to the first outer lateral side, the distance between the first outer lateral side and a second outer lateral side is equal to the first outer width, wherein each of the recesses has a first inner lateral side and a second inner lateral side which is opposite to the first inner lateral side, the distance between the first inner lateral side and the second inner lateral side is equal to the first inner width, wherein at least a gap is formed between the first inner lateral side and the first outer lateral side and between the second inner lateral side and the second outer lateral side.

* * * * *